United States Patent
Lulla et al.

(10) Patent No.: US 6,804,802 B1
(45) Date of Patent: Oct. 12, 2004

(54) JTAG INSTRUCTION REGISTER AND DECODER FOR PLDS

(75) Inventors: Navaz Lulla, Fremont, CA (US); Anup Nayak, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 436 days.

(21) Appl. No.: 09/599,586

(22) Filed: Jun. 22, 2000

(51) Int. Cl.[7] .............................................. G01R 31/28
(52) U.S. Cl. ........................................ 714/727; 714/30
(58) Field of Search ................................ 714/727, 724, 714/30, 726; 713/500; 716/4

(56) References Cited

U.S. PATENT DOCUMENTS

| | | | | |
|---|---|---|---|---|
| 5,325,368 A | * | 6/1994 | James et al. ................. | 714/727 |
| 5,355,369 A | * | 10/1994 | Greenberger et al. ....... | 714/727 |
| 5,377,198 A | * | 12/1994 | Simpson et al. ............ | 714/727 |
| 5,428,624 A | * | 6/1995 | Blair et al. .................. | 714/727 |
| 5,636,227 A | * | 6/1997 | Segars ......................... | 714/729 |
| 5,689,516 A | * | 11/1997 | Mack et al. ................. | 714/725 |
| 5,781,560 A | * | 7/1998 | Kawano et al. ............. | 714/727 |
| 6,058,255 A | * | 5/2000 | Jordan ......................... | 716/4 |

OTHER PUBLICATIONS

"IEEE Std 1149.1–1990: IEEE Standard Test Access Port and Boundary–Scan Architecture", IEEE, 1990.*
"IEEE Std 1149.1b–1994: Supplement to IEEE Std 1149.1–1990", IEEE, 1994.*

* cited by examiner

*Primary Examiner*—Guy J. Lamarre
(74) *Attorney, Agent, or Firm*—Christopher P. Maiorana, P.C.; Robert M. Miller

(57) ABSTRACT

An apparatus comprising a synchronous circuit configured to (i) shift a JTAG instruction signal in response to a first control signal, (ii) decode the JTAG instruction signal while the JTAG instruction signal is shifted and (iii) latch the decoded JTAG instruction signal in response to a second control signal.

20 Claims, 3 Drawing Sheets

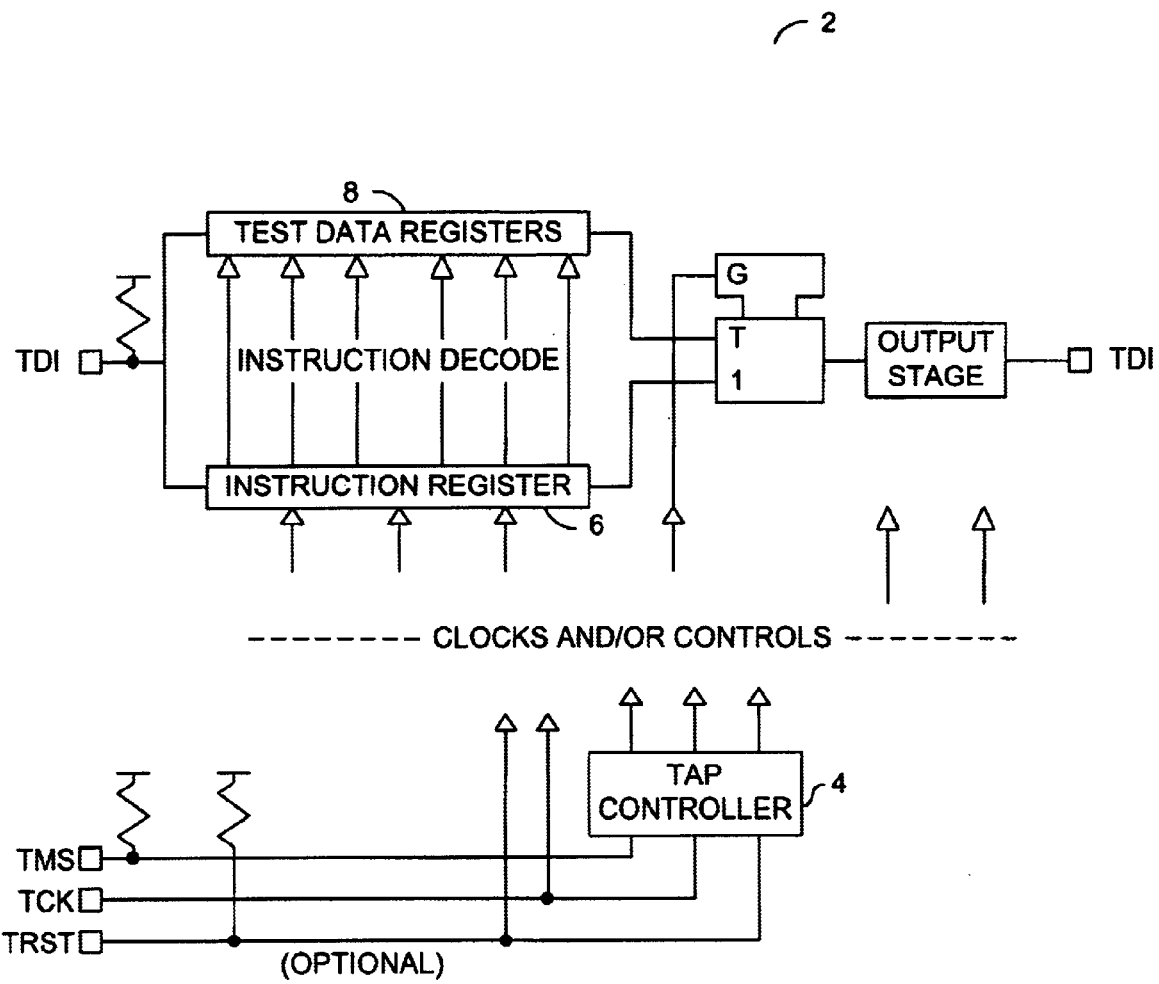
FIG. 1
(CONVENTIONAL)

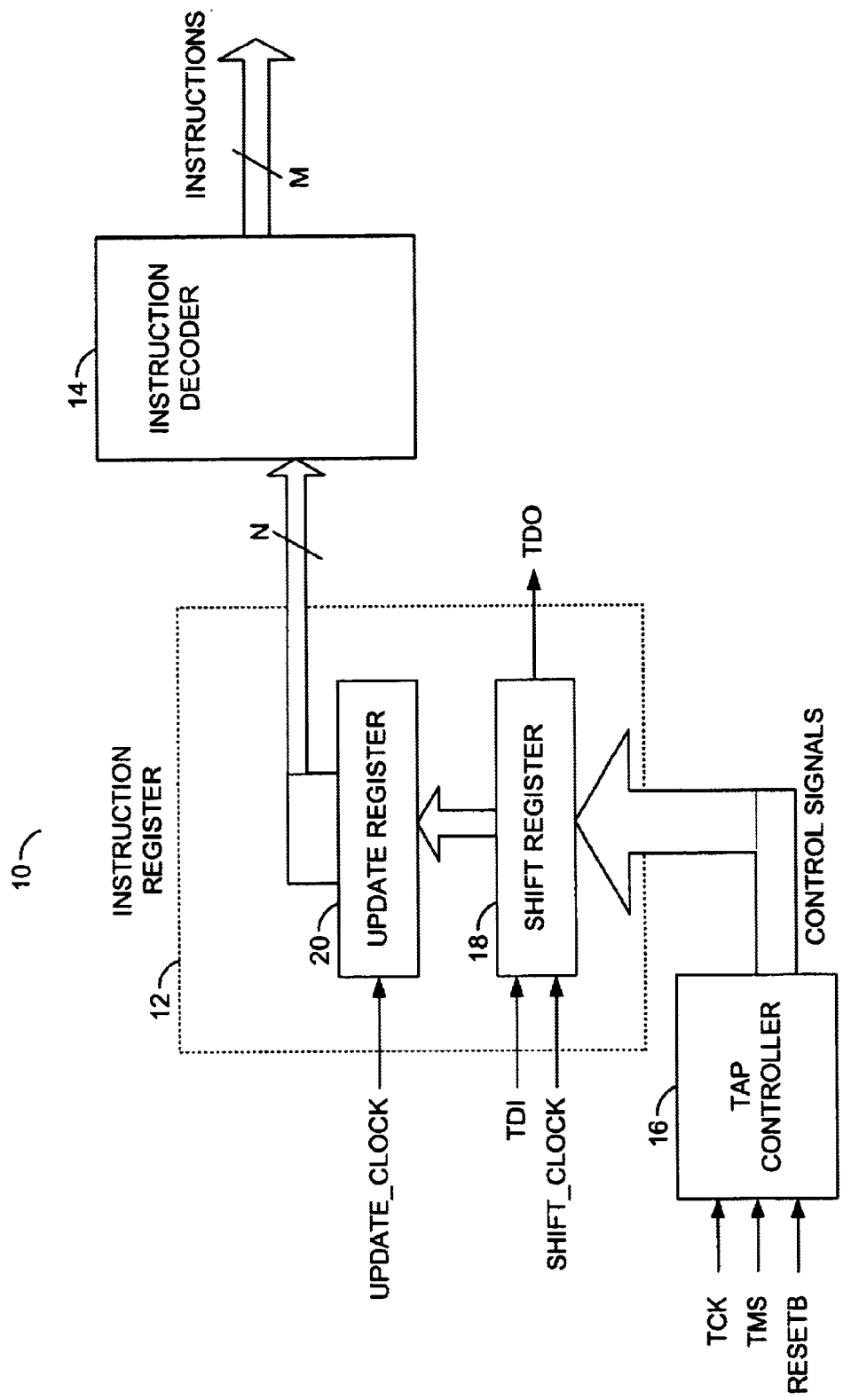
FIG. 2
(CONVENTIONAL)

JTAG INSTRUCTION REGISTER AND DECODER FOR PLDS

FIELD OF INVENTION

The present invention relates to a method and/or architecture for instruction registers and decoders in programmable logic devices generally and, more particularly, to a method and/or architecture for a JTAG instruction register and decoder for programmable logic devices.

BACKGROUND OF THE INVENTION

A programmable logic device (PLD) provides an economical and efficient means for implementing predetermined Boolean logic functions in an integrated circuit. Such a device consists of, generally, an AND plane configured to generate predetermined product terms in response to a plurality of inputs, a group of fixed/programmable OR gates configured to generate a plurality of sum-of-product(SOP) terms in response to the product terms, and a number of logic elements (i.e., macrocells) configured to generate a desired output in response to the sum-of-products terms. The sum-of-products terms can also be generated using programmable NORNOR logic.

Each macro-cell may contain a flip-flop called a macrocell flip-flop. The macrocell flip-flop is required to test the functionality of the macrocell and surrounding logic. Scan test procedures are conducted to test the macrocells and surrounding logic without increasing the device pin count. One such scan test procedure is a boundary scan test (i.e., JTAG boundary scan test in accordance with IEEE std 1149.1-1990, which is hereby incorporated by reference in its entirety). The PLD contains dedicated test logic to support the JTAG test procedures.

Referring to FIG. 1, a block diagram of a dedicated test logic circuit 2 illustrating a JTAG test access port (TAP) controller as contained in the IEEE standard is shown. A JTAG boundary scan test is conducted with JTAG test instrumentation connected to dedicated I/O pins of the PLD (i.e., a test access port or TAP). The TAP includes connections for a test clock (i.e., TCK), a test mode select (i.e., TMS), a test data input (i.e., TDI), and a test data output (i.e., TDO). A connection may also be provided for a test reset (i.e., TRST). The dedicated test logic includes a TAP controller 4, an instruction register 6, and test data registers 8. The TAP controller 4 is a synchronous finite state machine that changes states in response to the signals TMS, TCK, and TRST. The TAP controller 4 controls the sequence of operations of the test logic circuitry in the PLD.

Operation of the TAP controller 4 is controlled by instructions received in the instruction register 6. The instructions are decoded to determine operations and functions of the test data registers 8.

Referring to FIG. 2, a block diagram illustrating a conventional dedicated test logic circuit 10 is shown. The circuit 10 has an instruction register 12, an instruction decoder 14, and a TAP controller 16. The instruction decoder 14 is a combinatorial N:M decoder block, where N and M are integers. The instruction register 12 includes a shift register 18 and an update register 20.

During a shift instruction register state of the TAP controller 16, an N-bit instruction is serially shifted into the shift register 18 in response to a first clock signal (i.e., SHIFT_CLOCK). When the instruction is fully loaded, the TAP controller 18 moves to an update instruction register state. During the update instruction register state, the N-bit instruction is latched into the update register 20 on a falling edge of a second clock signal (i.e., UPDATE_CLOCK). Latching the N-bit instruction ensures that the test logic 10 is protected from transient data patterns that occur when another instruction is loaded into the instruction register 12.

The latched N-bit instructions are presented to the instruction decoder 14. The instruction decoder 14 operates asynchronously. The instruction decoder 14 decodes the N-bit instructions into M-bit instructions that control the operation and function of the test logic 10. The instruction decoder 14 does not begin decoding an instruction until the instruction is loaded into the update register 20 during the update IR state of the TAP controller 18.

Since the instruction decoder 14 is asynchronous, the design of the instruction decoder 14 requires special consideration to avoid generating anomalous instructions during instruction transitions. As a result, the design of the instruction decoder 14 is complicated. When instructions are added to the instruction set of the-TAP controller 16, the design of the instruction decoder 14 must be re-evaluated to ensure that anomalous instructions are avoided. Functional simulation of the instruction decoder 14 may not catch glitches that can occur during instruction transitions. Furthermore, conventional instruction registers are generally asynchronous designs which are not preferred for synthesis.

SUMMARY OF THE INVENTION

The present invention concerns an apparatus comprising a synchronous circuit configured to (i) shift a JTAG instruction signal, (ii) decode the JTAG instruction signal and (iii) load the decoded JTAG instruction signal into a register.

The objects, features and advantages of the present invention include providing an instruction register and decoder circuit that may (i) be used easily with synthesis tools, (ii) allow the addition of instructions with minimal redesign, (iii) ensure proper instruction generation during instruction transitions without additional circuitry, (iv) provide a synchronous design, (v) decode instructions before updating and/or (vi) minimize anomalous instructions during transitions.

BRIEF DESCRIPTION OF THE DRAWING

These and other objects, features and advantages of the present invention will be apparent from the following detailed description and the appended claims and drawings in which:

FIG. 1 is a block diagram illustrating a reference JTAG test access port (TAP) controller;

FIG. 2 is a block diagram illustrating a conventional instruction register and decoder for a programmable logic device.

DETAILED DESCRIPTION OF THE PREFERRED EMBODIMENTS

Figure 3:
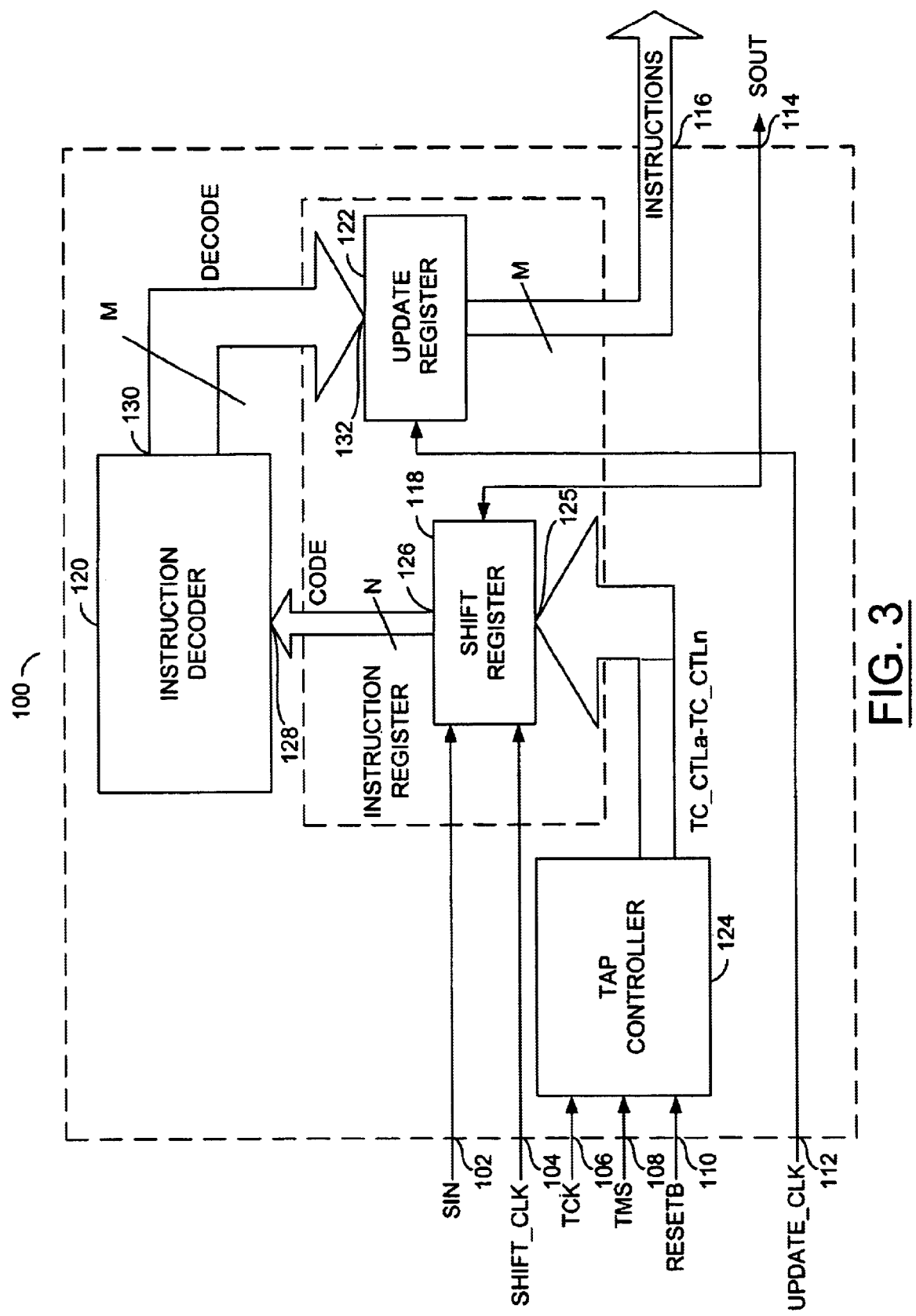
FIG. 3 is a block diagram illustrating a preferred embodiment of the present invention.

Referring to FIG. 3, a block diagram of a circuit 100 illustrating a preferred embodiment of the present invention is shown. The circuit 100 may provide a synchronous instruction register and decoder circuit for programmable logic devices (PLDs) In one example, the circuit 100 may be implemented as a JTAG TAP controller, instruction register, and decoder circuit for performing boundary scan tests (e.g., JTAG boundary scan test in accordance with IEEE std 1149.1-1990) in a PLD.

The circuit 100 may have an input 102 that may receive a signal (e.g., SIN), an input 104 that may receive a signal (e.g., SHIFT_CLK), an input 106 that may receive a signal (e.g., TCK), an input 108 that may receive a signal (e.g., TMS), an input 110 that may receive a signal (e.g., RESETB), an input 112 that may receive a signal (e.g., UPDATE_CLK), an output 114 that may present a signal (e.g., SOUT), and an output 116 that may present a signal (e.g., INSTR).

The signals SIN and SOUT may contain test instructions and data. In one example, the signals SIN and SOUT may be serial bit streams that may contain N-bit instructions, where N is an integer. The signals SHIFT_CLK, UPDATE_CLK, and TCK may be clock signals. The signals TCK, TMS, and RESETB may be used as control signals for test logic implemented in accordance with the JTAG test standard. The signal INSTR may be a test instruction signal for controlling operation and functions of the test logic. The signal INSTR may be, in one example, M-bits wide, where M is an integer. In one example, each bit of the signal INSTR may be used as a test instruction signal. The signal INSTR may be generated in response to the signals SIN, SHIFT_CLK, TCK, TMS, RESETB, and UPDATE_CLK. The signal SOUT may be generated in response to a number of the signals SIN, SHIFT_CLK, TCK, TMS, RESETB, and UPDATE_CLK.

The circuit 100 may comprise a circuit 118, a circuit 120, a circuit 122, and a circuit 124. The circuit 118 may be implemented, in one example, as a shift register. The circuit 120 may be, in one example, a decoder circuit. In one example, the circuit 120 may be implemented as a combinatorial N:M decoder circuit. The circuit 122 may be implemented, in one example, as an update register. The circuit 124 may be implemented, in one example, as a JTAG test access port (TAP) controller.

The circuit 118 may be implemented, in one example, as an N-bit shift register having a serial input, a serial output, and a parallel output. However, other types of registers may be implemented to meet the design criteria of a particular application. The circuit 118 may be configured to receive the signal SIN, the signal SHIFT_CLK, and generate the signal SOUT. Additionally, the circuit 118 may have an input 125 that may receive a number of control signals (e.g., TC_CTLa–TC_CTLn) and an output 126 that may present a signal (e.g., CODE) to an input 128 of the circuit 120. The decoder 120 may decode the signal CODE during or after a shift of the shift register 118. The signal CODE may be N-bits wide. In one example, the signal CODE may be implemented as a shifted code signal. The circuit 118 may be configured to generate the signals CODE and SOUT in response to the signals SIN, SHIFT_CLK, and TC_CTLa–TC_CTLn.

The circuit 120 may have an output 130 that may present a signal (e.g., DECODE) to an input 132 of the circuit 122. The signal DECODE may be M-bits wide. In one example, the circuit 120 may be configured to generate the signal DECODE in response to a logical combination of the bits of the signal CODE. The signal DECODE may comprise, in one example, one or more JTAG test instructions.

The circuit 122 may be implemented, in one example, as an M-bit update register or latch. However, other types of registers may be implemented to meet the design criteria of a particular application. The signal DECODE may be presented to the circuit 122. The circuit 122 may be configured, in one example, to latch the signal DECODE in response to, in one example, a falling edge of the signal UPDATE_CLK.

The circuit 122 may present the latched data of the signal DECODE as the signal INSTR.

The circuit 124 may be implemented, in one example, as a finite state machine. The circuit 124 may have a number of states (e.g., a shift IR state, an update IR state, etc.). The circuit 124 may receive the signals TCK, TMS and RESETB. The circuit 124 may be configured to move between states in response to the signals TCK, TMS, and RESETB. The circuit 124 may be configured to generate the signals TC_CTLa–TC_CTLn in response to the signals TCK, TMS, and RESETB. The signals TC_CTLa–TC_CTLn may be, in one example, test control signals for JTAG testing.

During the shift instruction register state of the circuit 124, the circuit 100 may convert a serial bit stream of test instruction data to a number of N-bit instructions by shifting the data into the shift register 118. The circuit 100 may present the N-bit instructions to the decoder circuit 120. The decoder circuit 120 may decode the N-bit instructions to generate M-bit instructions, as the N-bit instructions are shifted into the circuit 118. During the update instruction register state of the circuit 124, the circuit 100 may (i) latch the M-bit instructions generated by the decoder circuit 120 and (ii) present the latched M-bit instructions as control signals (e.g., INSTR) to the JTAG scan test logic.

In one embodiment, the circuit 100 may comprise a synchronous circuit configured to (i) shift a JTAG instruction signal in response to a first control signal, (ii) decode the JTAG instruction signal while the JTAG instruction signal is shifted and (iii) latch the decoded JTAG instruction signal in response to a second control signal. The circuit 100 may provide a synchronous design for a JTAG instruction register and decoder. The synchronous design may provide decoder outputs that are stable (e.g., without glitches) during transitions between instructions.

The synchronous design may also ensure that glitches on the output of the instruction register and decoder are generally eliminated, without a complicated design process or additional logic. By providing a synchronous design, the circuit 100 may be easily used with synthesis tools. The circuit 100 may allow implementation of additional instructions with minimal design effort. The design of the instruction decoder in accordance with the present invention may be less complicated.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a synchronous circuit configured to (i) shift a JTAG instruction signal in response to a first control signal, (ii) decode said JTAG instruction signal while said JTAG instruction signal is shifted and (iii) latch said decoded JTAG instruction signal in response to a second control signal.

2. The apparatus according to claim 1, further comprising a controller configured to generate (i) said first control signal during a shift instruction register state and (ii) said second control signal during an update instruction register state.

3. The apparatus according to claim 2, wherein said controller comprises a JTAG test access port controller.

4. The apparatus according to claim 1, wherein said latched decoded JTAG instruction signal is stable during transitions between instructions.

5. The apparatus according to claim 1, wherein said JTAG instruction signal comprises instructions for a state machine.

6. The apparatus according to claim 1, wherein said synchronous circuit comprises:

an input circuit configured to generate a first number of signals in response to said JTAG instruction signal and said first control signal;

a decoder circuit configured to decode said first number of signals to generate a second number of signals; and an output circuit configured to load said second number of signals in response to said second control signal.

7. The apparatus according to claim 6, wherein said decoder comprises a JTAG instruction decoder.

8. The apparatus according to claim 6, wherein said decoder comprises a combinatorial instruction decoder.

9. The apparatus according to claim 6, wherein said second number of signals is greater than said first number of signals.

10. The apparatus according to claim 6, wherein said output circuit comprises a register.

11. The apparatus according to claim 6, wherein said input circuit comprises a shift register.

12. The apparatus according to claim 1, wherein said JTAG instruction signal comprises a serial bitstream.

13. The apparatus according to claim 1, wherein said decoded JTAG instruction signal comprise one or more JTAG instructions.

14. The apparatus according to claim 1, wherein said apparatus comprises a JTAG test access port.

15. The apparatus according to claim 1, wherein said apparatus comprises a programmable logic device.

16. An apparatus comprising:

means for shifting JTAG instruction information in response to a first control signal;

means for decoding said JTAG instruction information while said JTAG instruction information is shifting; and means for latching said decoded JTAG instruction information in response to a second control signal.

17. The apparatus according to claim 16, further comprising:

means for providing a number of states in response to said JTAG instruction information, wherein said first control signal is generated during a shift instruction register state and said second control signal is generated during an update instruction register state.

18. A method for generating JTAG instructions in a programmable logic device comprising the steps of:

(A) shifting JTAG instruction information during a shift instruction register state;

(B) decoding said JTAG instruction information while said JTAG instruction information is being shifted; and (C) loading said decoded JTAG instruction information into a register during an update instruction register state.

19. The method according to claim 18, further comprising the step of:

(D) moving between a number of states in response to said JTAG instruction information.

20. The method according to claim 18, wherein said step (B) further comprises presenting said JTAG instruction information to a combinatorial decoder during said shift instruction register state.

* * * * *